(12) United States Patent
Kang

(10) Patent No.: US 7,139,185 B2
(45) Date of Patent: Nov. 21, 2006

(54) FERAM HAVING COMMON MAIN BIT LINE

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 107 days.

(21) Appl. No.: 11/057,168

(22) Filed: Feb. 15, 2005

(65) Prior Publication Data
US 2005/0207203 A1 Sep. 22, 2005

(30) Foreign Application Priority Data
Mar. 22, 2004 (KR) .................. 10-2004-0019255

(51) Int. Cl.
G11C 11/22 (2006.01)
(52) U.S. Cl. .................. 365/145; 365/196; 365/210
(58) Field of Classification Search ................ 365/145, 365/196, 210
See application file for complete search history.

(56) References Cited
U.S. PATENT DOCUMENTS
6,272,594 B1  8/2001  Gupta et al.
6,363,439 B1  3/2002  Battles et al.
6,594,174 B1 * 7/2003  Choi et al. .................. 365/145

FOREIGN PATENT DOCUMENTS
JP  2001-028427  1/2001

* cited by examiner

Primary Examiner—David Lam
(74) Attorney, Agent, or Firm—Heller Ehrman LLP

(57) ABSTRACT

A nonvolatile ferroelectric memory device has an improved cell array structure where one main bit line is connected in common to a plurality of sub bit lines, thereby reducing the layout area of the memory and facilitating the process. The nonvolatile ferroelectric memory device having a common main bit line comprises a plurality of cell array blocks, a plurality of sense amplifiers, a main amplifier unit, and a data bus unit. The plurality of cell array blocks, which include main bit lines shared by a plurality of sub bit lines each adjacent left and right to the main bit line, induce a sensing voltage of the main bit line depending on a voltage applied to the plurality of sub bit lines by cell data.

17 Claims, 10 Drawing Sheets

FERAM HAVING COMMON MAIN BIT LINE

BACKGROUND ART

1. Field of the Invention

The present invention generally relates to a nonvolatile ferroelectric memory device, and more specifically, to a nonvolatile ferroelectric memory device having a multi bit line structure where the main bit line is shared by a plurality of sub bit lines to improve a cell array structure, thereby reducing the number of main bit lines, and layout area of the memory and making the layout process easier.

2. Description of the Prior Art

Generally, a ferroelectric random access memory (hereinafter, referred to as 'FeRAM') has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

FIG. 1 is a circuit diagram illustrating a cell array block having a conventional multi bit line structure.

In each sub cell array, main bit lines MBL are connected one by one to the sub bit lines SBL in parallel.

When a sub bit line selecting signal SBSW1 is activated, corresponding NMOS transistors N5 and N10 are turned on, so that loads of main bit lines MBL<0> and MBL<1> are burdened at levels of one corresponding sub bit line SBL<0> or SBL<1>. Also, when a sub bit line pull-down signal SBPD is activated, NMOS transistors N3 and N8 are turned on, so that the sub bit line SBL<0> or SBL<1> is regulated at a ground voltage level.

A sub bit line pull-up signal SBPU is to regulate power which is supplied to the sub bit lines SBL<0> and SBL<1>, and sub bit line selecting signals SBSW2_L and SBSW2_R are to regulate signal flow between the sub bit line pull-up signal SBPU and the sub bit lines SBL<0> and SBL<1>, respectively.

For example, when a high voltage is required to be generated in a low voltage, a voltage higher than a power voltage VCC is supplied as the sub bit line pull-up signal SBPU. Then, when the sub bit line selecting signal SBSW2_L is activated, a NMOS transistor N4 is turned on, so that the high voltage is supplied to the sub bit line SBL<0>. A plurality of cells each comprising a NMOS transistor and a ferroelectric capacitor are connected to the sub bit line SBL<0> and SBL<1>, respectively.

A NMOS transistor N1 is connected between a ground voltage terminal and a NMOS transistor N2, and a NMOS transistor N6 is connected between the ground voltage terminal and a NMOS transistor N7. Each of the NMOS transistors N1 and N6 receives a main bit line pull-down signal MBPD. The NMOS transistor N2, connected between the NMOS transistor N1 and the main bit line MBL<0>, has a gate connected to the sub bit line SBL<0>. The NMOS transistor N7, connected between the NMOS transistor N6 and the main bit line MBL<1>, has a gate connected to the sub bit line SBL<1>. When the main bit line pull-down signal MBPD is activated, each of the NMOS transistors N2 and N7 regulates the amount of current leaked from the main bit line MBL<0> and MBL<1> depending on data values of the sub bit lines SBL<0> and SBL<1>, thereby inducing sensing voltages of the main bit lines MBL<0> and MBL<1>. That is, voltages of different levels applied to the sub bit lines SBL<0> and SBL<1> vary channel resistance of the NMOS transistors N2 and N7 depending on cell data, thereby regulating the sensing voltages of the main bit lines MBL<0> and MBL<1> to have different levels.

A sense amplifier senses and amplifies a voltage difference of the main bit lines which is generated through the above-described principle.

FIG. 2 is a cross-sectional diagram illustrating a main bit line and a sub bit line which have the structure of FIG. 1.

Main bit lines MBL<0>~MBL<3> are connected one by one to sub bit lines SBL<0>~SBL<3> to be paired off.

In this multi bit line structure, the sub bit line SBL is formed of poly silicon or tungsten metal. On the other hand, the main bit line MBL is formed of Al or Cu. However, since thick metal is used to reduce resistance, the width and space of the metal become larger than those of other layers.

As the size of the cell becomes smaller, the space between the main bit lines becomes also smaller. As a result, the technology of securing a space for formation of main bit lines is required.

SUMMARY OF THE INVENTION

Accordingly, it is an object of the present invention to reduce a layout area of a memory by improving a structure between main bit lines and sub bit lines, thereby facilitating the process.

In an embodiment, a nonvolatile ferroelectric memory device having a common main bit line comprises a plurality of cell array blocks, a plurality of sense amplifiers, a main amplifier unit, and a data bus unit. The plurality of cell array blocks, which include main bit lines shared by a plurality of sub bit lines each adjacent left and right to the main bit line, induce a sensing voltage of the main bit line depending on a voltage applied to the plurality of sub bit lines by cell data. The plurality of sense amplifiers, each positioned at one side of each cell array block to correspond one by one to the cell array block, sense and amplify the sensing voltage of the main bit line. The main amplifier unit amplifies data outputted from the sense amplifier unit to a data buffer. The data bus unit connects the main amplifier unit to the sense amplifier units to transmit data to be read or written.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 3:
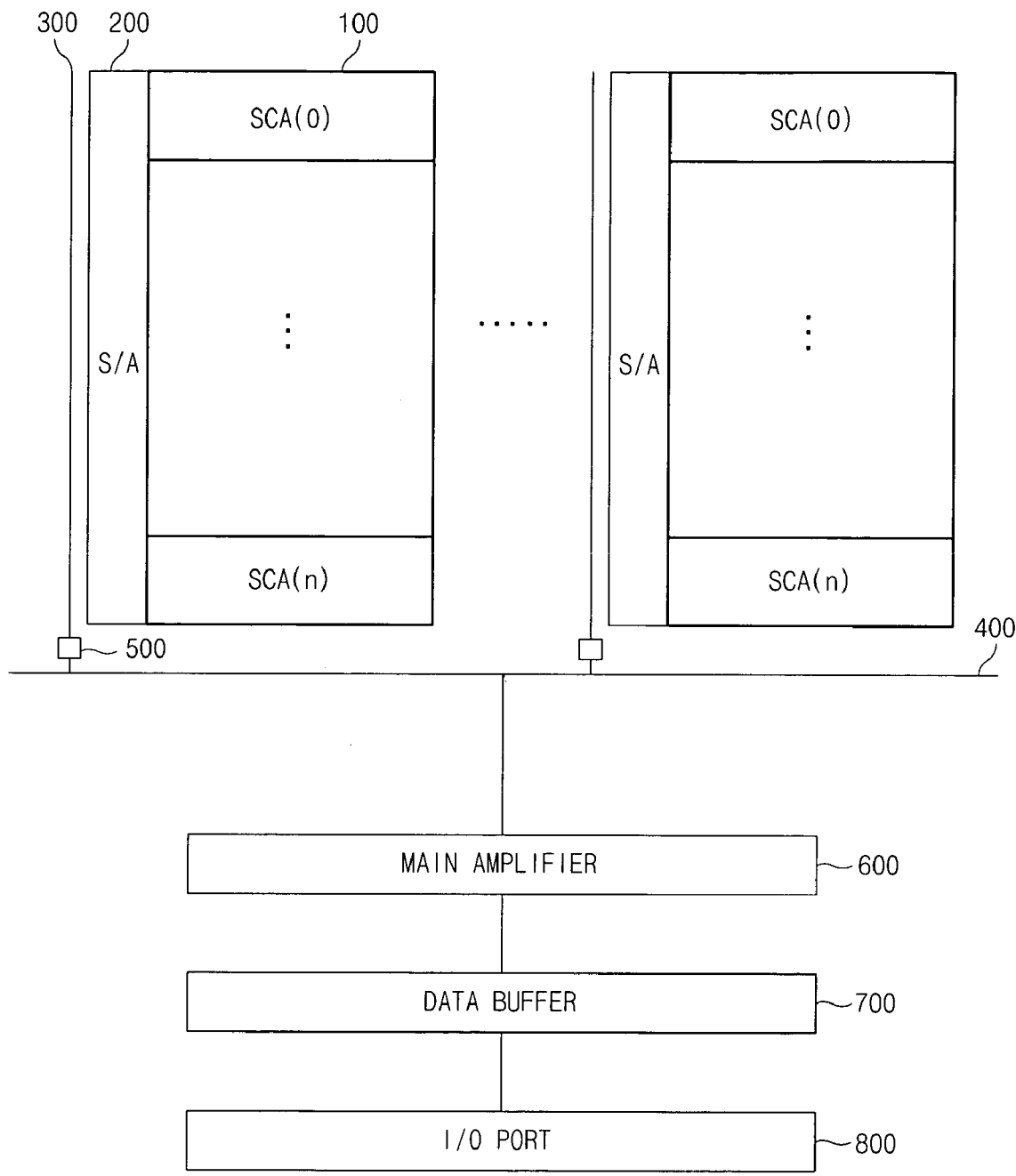
FIG. 3 is a diagram illustrating a nonvolatile ferroelectric memory device according to an embodiment of the present invention.

FIG. 3 is a diagram illustrating a nonvolatile ferroelectric memory device according to an embodiment of the present invention.

In an embodiment, a nonvolatile ferroelectric memory device comprises a plurality of cell array blocks 100, a plurality of sense amplifiers 200, a plurality of local data buses 300, a global data bus 400, a plurality of data bus switches 500, a main amplifier 600 a data bus 700 and a I/O port 800.

Each of the cell array blocks 100 comprises a plurality of sub cell arrays SCA(0)~SCA(n), and each of the sub cell arrays SCA(0)~SCA(n) comprises a cell array for storing data. The cell array block 100 which comprises a plurality of main bit lines and a plurality of sub bit lines is lower bit line of the main bit line varies the amount of current leaked from the main bit lines depending on cell data applied to the sub bit lines, thereby inducing sensing voltages of the main bit lines. Each main bit line is shared by the whole sub cell arrays SCA(0)~SCA(n) in parallel with the local data bus 300. Each sub bit line is divided into a plurality of sub cell array SCA(0)~SCA(n) and connected to the main bit lines. Specifically, each main bit line is shared by a plurality of sub bit lines adjacent left and right to the main bit line. That is, in the same sub cell array, while one main bit line corresponds to one sub bit line in the prior art (see FIG. 1), one main bit line is shared by two sub bit lines adjacent left and right to the main bit line according to an embodiment of the present invention. As a result, the number of main bit lines in the cell array block 100 is reduced in half in comparison with the prior art (see FIG. 1).

The sense amplifier unit 200 senses and amplifies a sensing voltage of the main bit line to selectively output the sensing voltage to the local data bus 300, and transmits write data applied through the local data bus 300 to the main bit line. The sense amplifier unit 200 is positioned between the cell array block 100 and the local data bus 300 to correspond one by one to the cell array block 100. In other words, while a conventional sense amplifier senses cell data applied through a common data bus, the sense amplifier unit 200 according to an embodiment of the present invention directly senses a sensing voltage of the main bit line not through a common data bus. Each of the sense amplifier units 200 which correspond one by one to main bit lines in the corresponding cell array block 100 comprises a plurality of sense amplifiers for sensing and amplifying voltages of the corresponding main bit lines.

The local data bus 300 transmits the sensing voltage (read data) sensed in the sense amplifier unit 200 to the global data bus 400, and transmits write data applied through the global data bus 400 to the sense amplifier unit 200. The local data bus 300 is positioned at one side of the sense amplifier unit 200 to correspond one by one to the cell array block 100.

The local data bus 300 comprises the predetermined number of bus lines which corresponds to that of data simultaneously inputted or outputted by one column selection. Each of the local data buses 300 is selectively connected to the global data bus 400 depending on on/off operation of the data bus switch 500 to share the global data bus 400.

The global data bus 400 transmits read data applied from the local data bus 300 to the main amplifier 600, and transmits write data applied from the main amplifier 600 to the local data bus 300. The global data bus 400 is selectively connected to one of the plurality of local data buses 300 depending on on/off operation of the data bus switch 500.

The main amplifier 600 amplifies read data applied from the global data bus 400 to transmit the read data to the buffer 700, and amplifies write data applied through the data buffer 700 to transmit the write data to the global data bus 400.

The data buffer 700 buffers read data to be externally outputted, and then transmits the read data to the I/O port 800. Also, the data buffer 700 buffers write data to be externally inputted through the I/O port 800, and then transmits the write data to the main amplifier 600.

Figure 4:
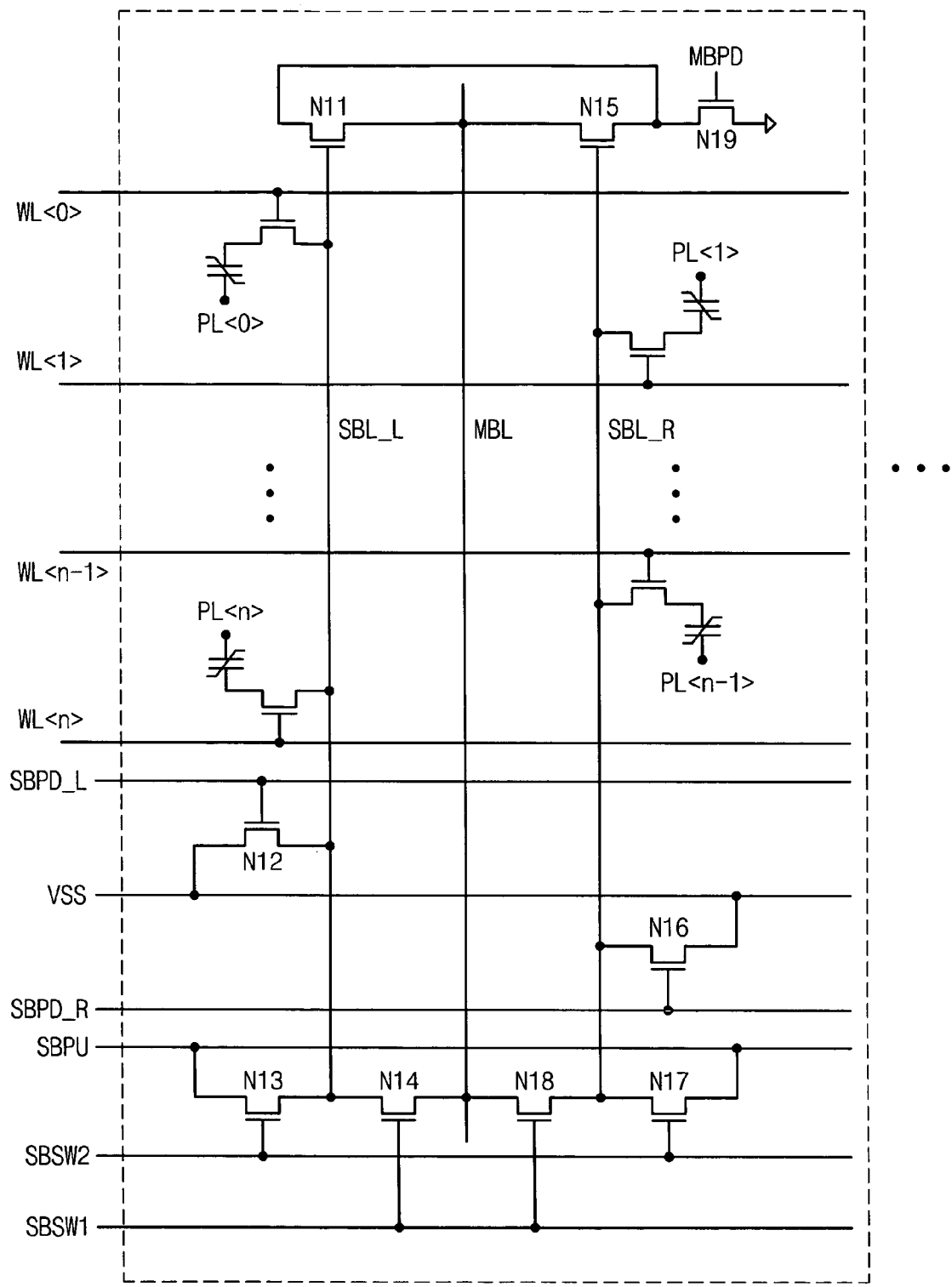
FIG. 4 is a circuit diagram illustrating the connection relationship of a main bit line and sub bit lines according to a first embodiment of the present invention.

FIG. 4 is a circuit diagram illustrating the connection relationship of a main bit line and sub bit lines according to a first embodiment of the present invention.

Figure 1:
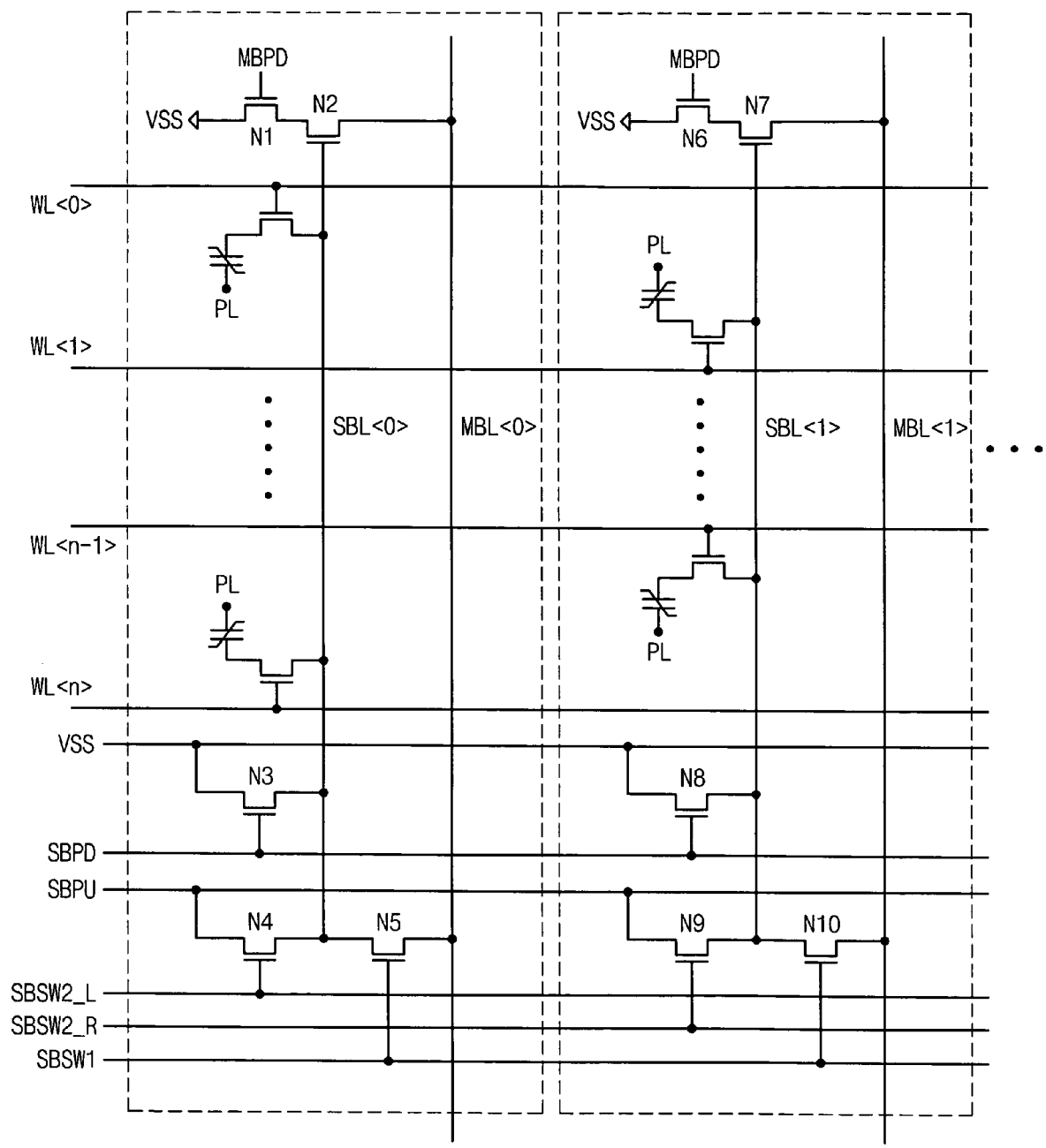
FIG. 1 is a circuit diagram illustrating a cell array block having a conventional multi bit line structure.
Figure 2:
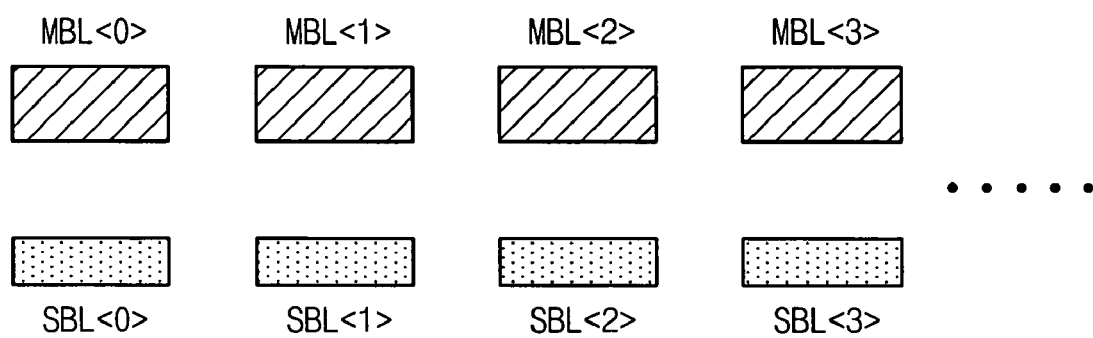
FIG. 2 is a cross-sectional diagram illustrating a main bit line and a sub bit line which have the structure of FIG. 1.

In the sub cell array of FIG. 4, each main bit line MBL is shared by two sub bit lines SBL_L and SBL_R adjacent left and right to the main bit line MBL. That is, as shown in FIG. 1, while one main bit line MBL is connected to one sub bit line SBL in the conventional sub cell array, one main bit line MBL is selectively connected to the two sub bit lines SBL_L and SBL_R in the sub cell array of FIG. 4.

The cell array. according to an embodiment of the present invention has a folded bit line structure where cells connected to the two sub bit lines SBL_L and SBL_R corresponding to the same main bit line MBL do not share word lines WL<0>~WL<n>.

When a sub bit line selecting signal SBSW1 is activated, transistors N14 and N18 are turned on, so that load of the main bit line MBL is burdened at levels of the sub bit lines SBL_L and SBL_R. When a sub bit line pull-down signal SBPD_L is activated, the sub bit line SBL_L is regulated at a ground voltage level due to turn-on of a NMOS transistor N12. When a sub bit line pull-down signal SBPD_R is activated, the sub bit line SBL_R is regulated at a ground voltage level due to turn-on of a NMOS transistor N16. That is, since the sub bit lines SBL_L and SBL_R share one main bit line in an embodiment of the present invention, the different sub bit line pull-down signals SBPD_L and SBPD_R are used to divide the sub bit lines SBL_L and SBL_R when data are read and written.

A sub bit line pull-up signal SBPU is to regulate power supplied to the sub bit lines SBL_L and SBL_R, and a sub bit line selecting signal SBSW2 is to regulate signal flow between the sub bit line pull-up signal SBPU and the sub bit lines SBL_L and SBL_R. When a high voltage is required to be generated in the sub bit lines SBL_L and SBL_R in a low voltage, a voltage higher than a power voltage VCC is supplied as the sub bit line pull-up signal SBPU. Then, when the sub bit line selecting signal SBSW2 is activated, NMOS transistors N13 and N17 are turned on, so that the high voltage is supplied to the sub bit lines SBL_L and SBL_R.

A NMOS transistor N19, connected between a ground voltage terminal and NMOS transistors N11 and N15, has a gate to receive a main bit line pull-down signal MBPD. The NMOS transistor N11, connected between the NMOS transistor N19 and the main bit line MBL, has a gate connected to the sub bit line SBL_L. The NMOS transistor N15, connected between the NMOS transistor N19 and the main bit line MBL, has a gate connected to the sub bit line SBL_R. When the main bit line pull-down signal MBPD is activated, each of the NMOS transistors N11 and N15 regulates the amount of current leaked from the main bit line MBL depending on data values of the sub bit lines SBL_L and SBL_R, thereby inducing the sensing voltage of the main bit line MBL.

For example, when the main bit line pull-down signal MBPD is activated and then the word line WL<0> and a plate line PL<0> are activated, data (HIGH or LOW) of the corresponding cell are supplied to the sub bit line SBL_L. A voltage of the sub bit line SBL_L is applied to a gate of the NMOS transistor N11 to be turned on. Here, channel resistance of the NMOS transistor N11 is differentiated depending on the cell data applied to the sub bit line SBL_L, so that the amount of current leaked through the NMOS transistors N11 and N19 becomes different in the main bit line MBL depending on cell data. As a result, the sensing voltage of the main bit line MBL is differently induced depending on the cell data. The sense amplifier unit 200 senses and amplifies a voltage difference of the main bit line MBL, and outputs the voltage difference to the local data bus 300.

Figure 5:
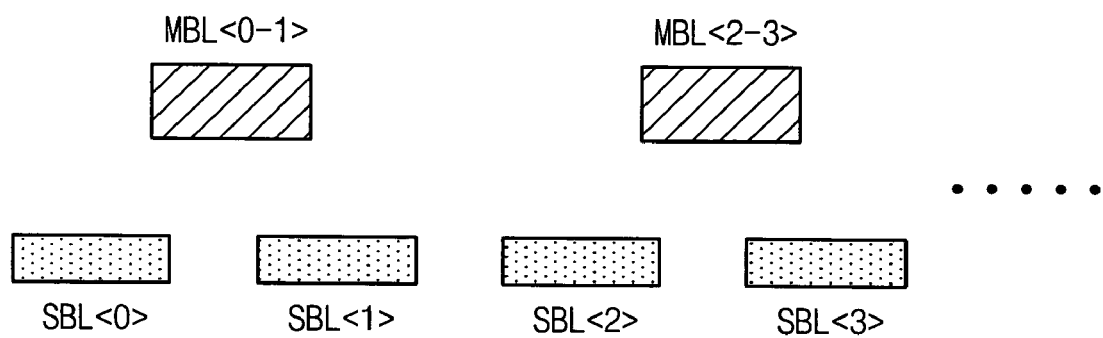
FIG. 5 is a cross-sectional diagram illustrating a main bit line and a sub bit line which have the structure of FIG. 4.

FIG. 5 is a cross-sectional diagram illustrating a main bit line and a sub bit line which have the structure of FIG. 4.

A main bit line MBL<0-1> is connected in common to two adjacent sub bit lines SBL<0> and SBL<1>, and a main bit line MBL<2-3> is connected in common to two adjacent sub bit lines SBL<2> and SBL<3>.

Figure 6:
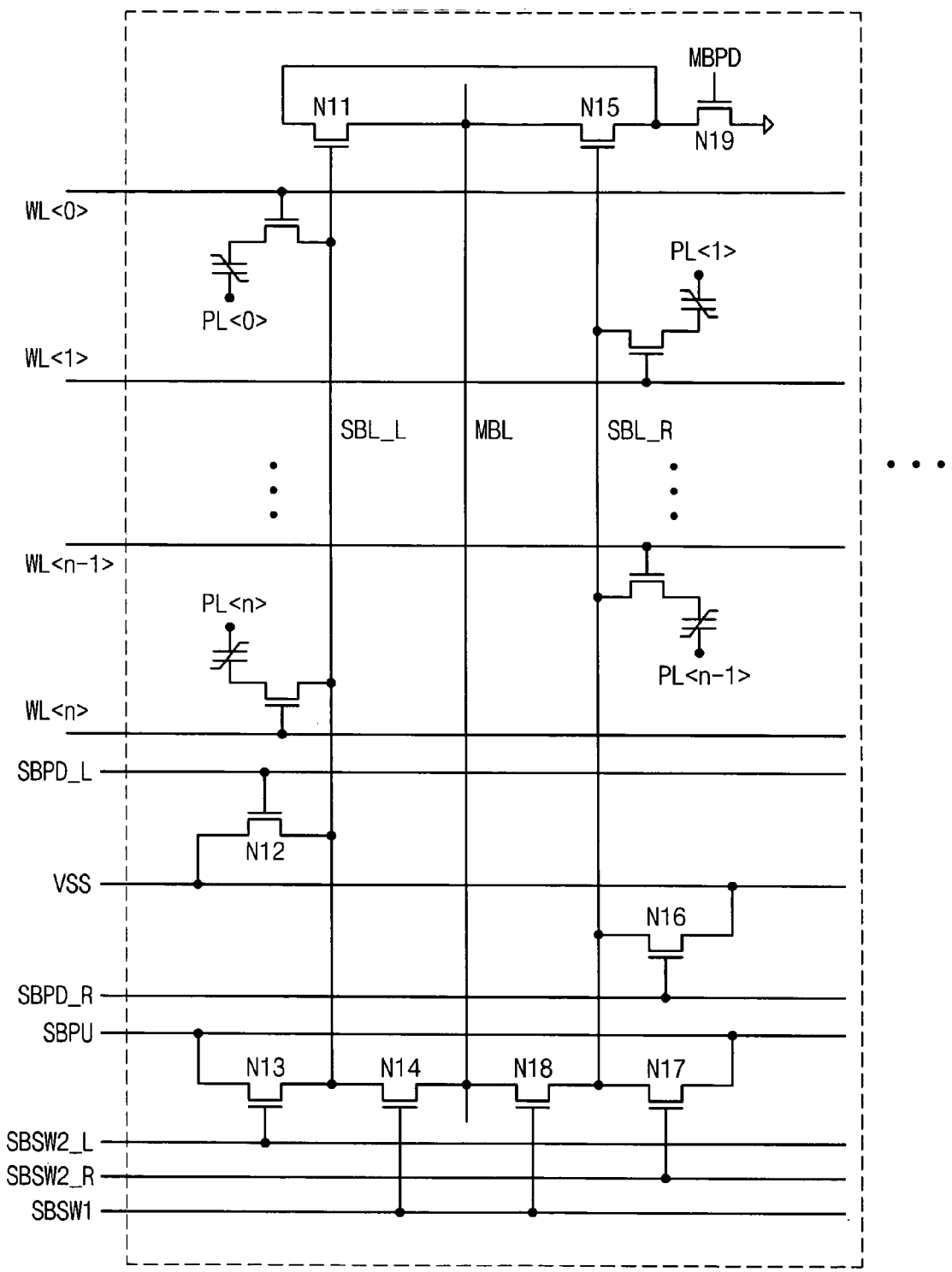
FIG. 6 is a circuit diagram illustrating the connection relationship of a main bit line and sub bit lines according to a second embodiment of the present invention.

FIG. 6 is a circuit diagram illustrating the connection relationship of a main bit line and sub bit lines according to a second embodiment of the present invention.

In an embodiment, the signal flow between the sub bit line pull-up signal SBPU line and the sub bit line SBL_L is controlled by using a sub bit line selecting signal SBSW2_L, and the signal flow between the sub bit line pull-up signal SBPU line and the sub bit line SBL_R is controlled by using a sub bit line selecting signal SBSW2_R.

The explanation of the second embodiment of FIG. 6 is omitted since the structure and operation of other circuits are the same as those of FIG. 4.

Figure 7:
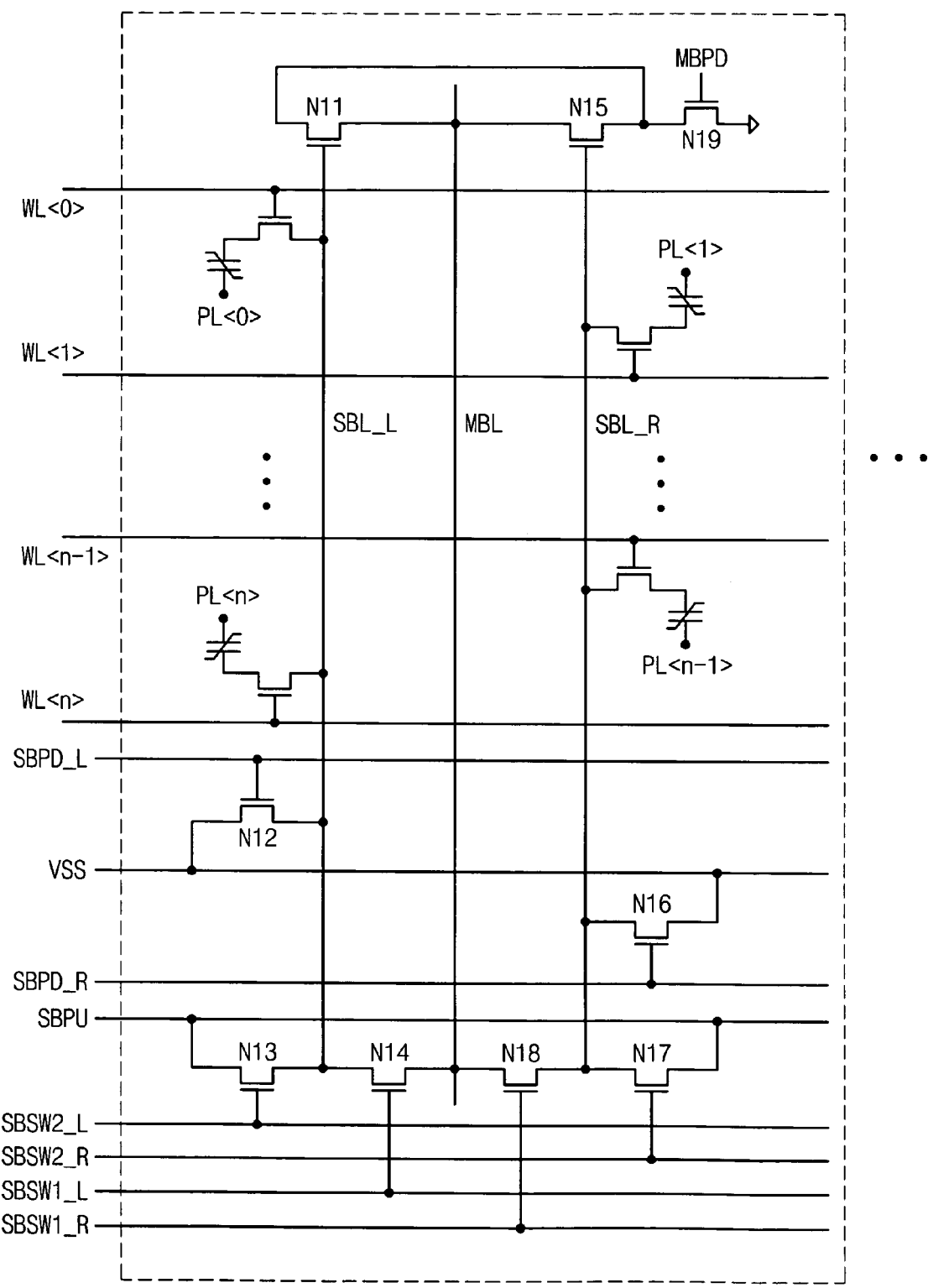
FIG. 7 is a circuit diagram illustrating the connection relationship of a main bit line and sub bit lines according to a third embodiment of the present invention.

FIG. 7 is a circuit diagram illustrating the connection relationship of a main bit line and sub bit lines according to a third embodiment of the present invention.

In an embodiment, data exchange between the main bit line MBL and the sub bit lines SBL_L and SBL_R is selectively regulated by using the sub bit line selecting signals SBSW1_L and SBSW1_R. That is, in a write or restore mode, data of the main bit line MBL are selectively applied to the sub bit lines SBL_L and SBL_R.

The structure and operation of other circuits are the same as those of FIG. 6.

Figure 8:
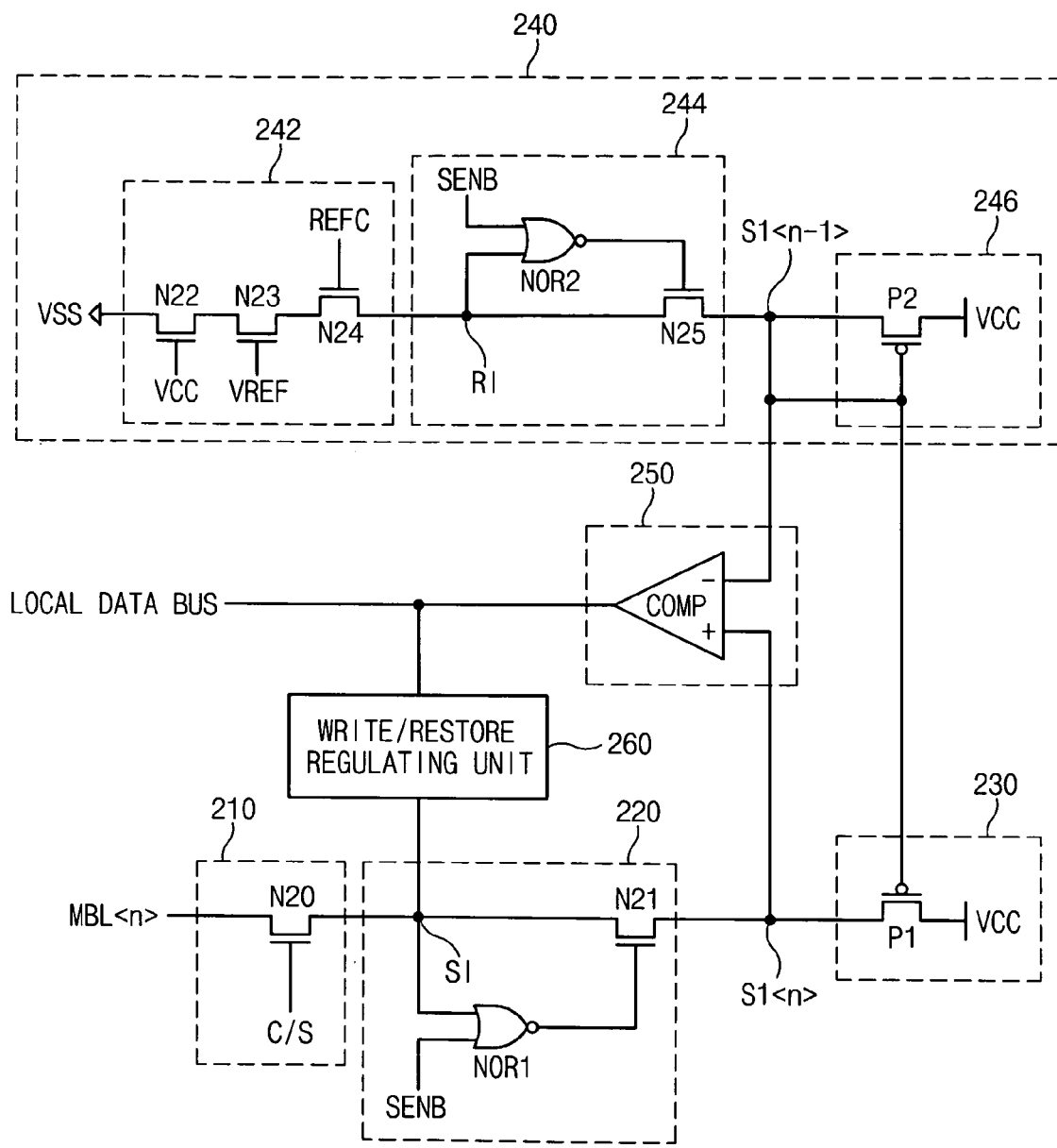
FIG. 8 is a circuit diagram illustrating the structure of one sense amplifier in a sense amplifier unit according to an embodiment of the present invention.

FIG. 8 is a circuit diagram illustrating the structure of one sense amplifier in the sense amplifier unit 200 according to an embodiment of the present invention.

In an embodiment, the sense amplifier comprises a column selecting unit 210, a MBL sensing unit 220, a sensing load unit 230, a reference voltage generating unit 240, a comparison amplification unit 250 and a write/restore regulating unit 260.

When a column selecting signal C/S is activated, the column selecting unit 210 connects the MBL sensing unit 220 to the main bit line MBL, and applies a voltage of the main bit line MBL to the MBL sensing unit 220. The column selecting unit 210 comprises a NMOS transistor N20 connected between the main bit line MBL and the MBL sensing unit 220. The NMOS transistor N20 has a gate to receive the column selecting signal C/S.

The MBL sensing unit 220 senses and amplifies the voltage of the main bit line MBL applied through the column selecting unit 210 in response to a sensing signal SENB. Here, the MBL sensing unit 220 inverts and amplifies the voltage of the main bit line MBL when the sensing signal SENB is activated ("LOW"), and regulates a level of an output voltage depending on the level of the inverted and amplified voltage. The MBL sensing unit 220 comprises a NOR gate NOR1 and a NMOS transistor N21. The NOR gate NOR1 performs a NOR operation on the sensing signal SENB and an output signal from the column selecting unit 210. The NMOS transistor N21, connected between nodes S1<n> and SI, has a gate to receive an output signal from the NOR gate NOR1.

The sensing load unit 230 regulates sensing load of the MBL sensing unit 220 depending on an output voltage (reference voltage) of the reference voltage generating unit 240. The sensing load unit 230 comprises a PMOS transistor P1 which is connected between a power voltage VCC terminal and the node S1<n> and has a gate to receive the reference voltage. That is, channel resistance of the PMOS transistor P1 is varied depending on the reference voltage, so that the sensing load unit 230 regulates the amount of current applied from the power voltage terminal VCC to the node S1<n> to control the sensing load.

The reference voltage generating unit 240 generates the reference voltage in response to a reference voltage regulating signal VREF when a reference voltage column selecting signal REFC is activated. The reference voltage generating unit 240 comprises a reference current regulating unit 242, a reference voltage sensing unit 244 and a sensing load unit 246.

The reference current regulating unit 242 regulates current leakage of the reference voltage generating unit 240 in response to a reference voltage regulating signal VREF, thereby variably inducing generation of the reference voltage. The reference current regulating unit 242 comprises NMOS transistors N22, N23 and N24 connected between a node RI and a ground voltage VSS terminal. The NMOS transistors N22, N23 and N24 have gates to receive a power voltage VCC, the reference voltage regulating signal VREF and the reference voltage column selecting signal REFC, respectively. Here, the NMOS transistors N22 and N23 perform the same operation as those of the NMOS transistors N19 and N11(N15) for inducing the sensing voltage of the main bit line MBL in the cell array, respectively. In other words, the reference current regulating unit 242 regulates channel resistance of the NMOS transistor N23 depending on a voltage level of the reference voltage regulating signal VREF, and controls the amount of current leaked through the reference current regulating unit 242, thereby inducing generation of the reference voltage.

The reference voltage sensing unit 244 senses and amplifies an output voltage of the reference current regulating unit 242 in response to the sensing signal SENB. Here, the reference voltage sensing unit 244 inverts and amplifies an output voltage of the reference current regulating unit 242 when the sensing signal SENB is activated ("LOW"), and regulates an output level of the output voltage (reference voltage) depending on the level of the inverted and amplified signal. The reference voltage sensing unit 244 comprises a NOR gate NOR2 and a NMOS transistor N25. The NOR gate NOR2 performs a NOR operation on the sensing signal SENB and a signal of the node RI. The NMOS transistor N25, connected between nodes S1<n−1> and RI, has a gate to receive an output signal from the NOR gate NOR2.

The sensing load unit 246 regulates sensing load of the reference voltage sensing unit 244 depending on the output voltage (reference voltage) of the reference voltage generating unit 240. The sensing load unit 246 comprises a PMOS transistor P2 which is connected between the power voltage VCC terminal and the node S1<n−1> and has a gate to receive the reference voltage. That is, channel resistance of the PMOS transistor P2 is varied depending on the reference voltage, so that the sensing load unit 246 regulates the amount of current applied from the power voltage terminal VCC to the node S1<n−1> to control the sensing load.

The comparison amplification unit 250 compares output voltages of the MBL sensing unit 220 and the reference voltage generating unit 240, and amplifies data sensed in the MBL sensing unit 220 to output the data to the local data bus 300. The comparison amplification unit 250 comprises a comparator COMP for receiving output signals from the MBL sensing unit 220 and the reference voltage generating unit 240.

The write/restore regulating unit 260 transmits write data and read data applied to the local data bus 300 to the column selecting unit 210.

Figure 9:
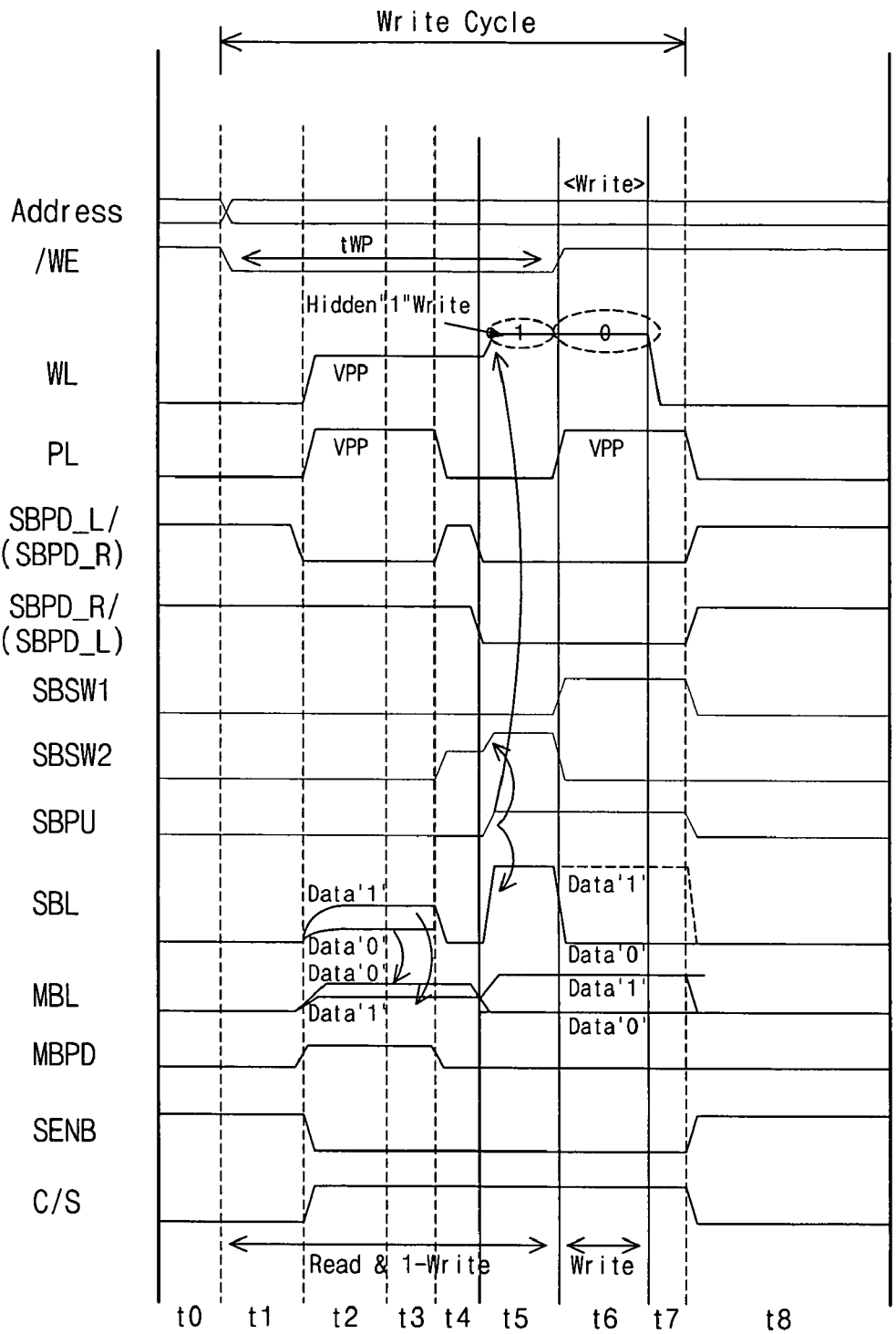
FIG. 9 is a timing diagram illustrating the write operation of a nonvolatile ferroelectric memory device according to an embodiment of the present invention.

FIG. 9 is a timing diagram illustrating the write operation of a nonvolatile ferroelectric memory device according to an embodiment of the present invention.

In a period t1, when an address is transited and a write enable signal /WE is inactivated to 'low', the operation becomes at a write mode active state.

Before the word line WL is activated by activation of the sub bit line pull-down signals SBPD_L(SBPD_R) and SBPD_R(SBPD_L), the sub bit lines SBL_L and SBL_R connected to one main bit line MBL are pulled down to 'low'.

In periods t2 and t3, data are sensed. In the period t2, when the word line WL and the plate line PL are enabled to 'high', data of the cell selected by the enabled word line WL are applied to the sub bit line SBL_L. Here, since cells connected to the sub bit lines SBL_L and SBL_R do not share the word lines WL<0>~WL<n>, cell data are applied to one sub bit line SBL_L of the sub bit lines SBL_L and SBL_R.

When the cell data are applied to the sub bit line SBL_L while the main bit line MBPD is activated, the NMOS transistor N11(N15) is turned on, so that the sensing voltage is induced to the main bit line MBL. Here, since the amount of current leaked through the NMOS transistor N11(N15) is differentiated depending on the cell data, the sensing voltage having a different level is induced to the main bit line MBL depending on the cell data.

The sensing voltage induced to the main bit line MBL is applied to the sense amplifier through the column selecting unit 210 in response to the column selecting signal C/S, and then sensed and amplified by the sense amplifier. After the MBL sensing unit 220 inverts and amplifies the voltage of the main bit line MBL, the voltage is applied to the NMOS transistor N21. As a result, the amount of current flowing through the NMOS transistor N21 is regulated depending on the cell data, and the voltage of the main bit line MBL is firstly amplified. That is, channel resistance of the NMOS transistor N8 is configured to be larger when the cell data is "0" than when the cell data is "1". As a result, the amount of current flowing through the NMOS transistor N21 is reduced, and the voltage level of the node S1<n> becomes higher. On the other hand, the channel resistance of the NMOS transistor N21 is configured to be smaller when the cell data is "1" than when the cell data is "0". As a result, the amount of current flowing through the NMOS transistor N8 is becomes larger, and the voltage level of the node S1<n> becomes lower. Therefore, the voltage difference between data 'high' and 'low' in the node S1<n> is amplified larger than that in the main bit line MBL.

When the sensing signal is activated to 'low', the reference voltage generating unit 240 inverts and amplifies a voltage induced by the reference current regulating unit 242, and regulates the level of the reference voltage with the inverted and amplified voltage to output the level to the comparison and amplification unit 250. In the reference current regulating unit 242, when the reference voltage column selecting signal REFC is activated, channel resistance of the NMOS transistor N23 is activated is regulated in response to the reference voltage regulating signal VREF, thereby controlling current leakage of the reference voltage generating unit 240 to induce generation of the reference voltage. Here, the NMOS transistors N22 and N23 perform the same operations as those of the NMOS transistors N19 and N11(N15) for inducing the sensing voltage of the main bit line MBL from the cell arrays, respectively, thereby inducing generation of the reference voltage. Then, the reference voltage sensing unit 244 and the sensing load unit 246 regulate the level of the reference voltage through the same principle as that in the MBL sensing unit 220 and the sensing load unit 230, respectively.

the comparison amplification unit 250 compares the reference voltage with the voltage firstly amplified in the MBL sensing unit 220 and secondly amplifies to output to the local data bus 300.

After the sensing operation is completed, a voltage of the plate line PL is inactivated to 'low' in a period t4, and the sub bit line pull-down signal SBPD_L is activated to 'high', so that the sub bit line SBL_L is regulated to the ground level.

Next, the sub bit line pull-down signals SBPD_L and SBPD_R are all transited to 'low' in a period t5. When the sub bit line pull-up signal SBPU is activated and level of the sub bit line selecting signal SBSW2 is increased to a pumping level, voltages of the sub bit line SBL_L and SBL_R are pumped to high levels, so that high data (Hidden "1") is written in the read cell regardless of external data. In case of FIGS. 6 and 7, the sub bit line selecting signal SBSW2_L is only increased to the pumping level, and only the voltage of the sub bit line SBL_L connected to the read cell can be pumped to the high level.

In a period t6, the write enable signal /WE is activated to 'high', data are written. That is, the voltages of the word line WL and the plate line PL are changed to the pumping level, and write data applied to the local data bus 300 are applied to the main bit line MBL through the column selecting unit 210 by the write/restore regulating unit 260.

The write data applied to the main bit line MBL are applied to the sub bit line SBL_L by activation of the sub bit line selecting signal SBSW1, and written in the cell. Here, the data written in the period t5 is maintained as it is when the data applied to the sub bit line SBL_L is 'high' while low data is written in the corresponding cell when the data of the sub bit line SBL_L is 'low'. That is, external low data ("0") is written in the cell in the period t6.

After the data are completely written, the word line WL is inactivated for a predetermined time earlier than the plate line PL.

Figure 10:
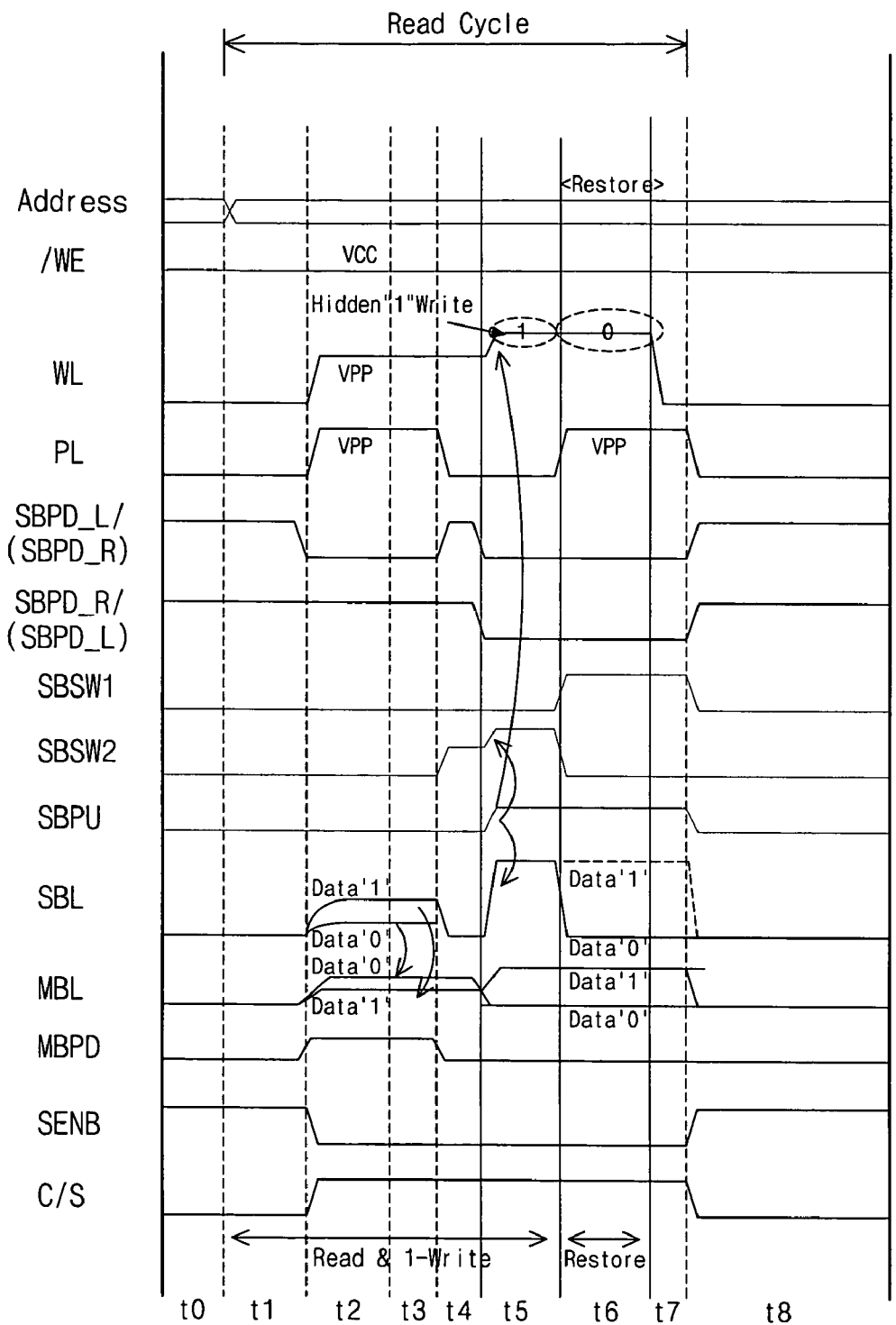
FIG. 10 is a timing diagram illustrating the read operation of a nonvolatile ferroelectric memory device according to an embodiment of the present invention.

FIG. 10 is a timing diagram illustrating the read operation of a nonvolatile ferroelectric memory device according to an embodiment of the present invention.

At the read mode, the write enable signal /WE is maintained at the power voltage VCC level.

The same operation for sensing and amplifying cell data and writing the hidden data "1" in the corresponding cell during the periods t0~t5 in FIG. 9 is also applied to periods t0~t5 in FIG. 10.

After the sensing and amplification are completed, the output signal (read data) of the comparison and amplification unit 250 is applied to the main bit line MBL through the write/restore regulating unit 260 and the column selecting unit 210.

In a period t6, when the voltages of the word line WL and the plate line PL are changed to the pumping level and the sub bit line selecting signal SBSW1 (SBSW1_L in FIG. 7) is activated, the read data applied to the main bit line MBL is applied to the sub bit lines SBL_L and SBL_R, and restored in the corresponding cell. Here, the data written in the period t5 is maintained as it is when the data of the sub bit line SBL is 'high' while the low data is written in the corresponding cell when the data of the sub bit line SBL is 'low'. Therefore, the period t6 is a restore period where the internally sensed and amplified data is re-written in the cell.

After the restore operation is completed, the word line WL is inactivated for a predetermined time earlier than the plate line PL.

As described above, a nonvolatile ferroelectric memory device according to an embodiment of the present invention has an improved cell array structure where one main bit line is connected in common to a plurality of sub bit lines, thereby reducing the layout area of the memory and facilitating the process.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device having a common main bit line, comprising:
   a plurality of cell array blocks, including main bit lines shared by a plurality of sub bit lines each adjacent left and right to the main bit line, for inducing a sensing voltage of the main bit line depending on a voltage applied to the plurality of sub bit lines by cell data;
   a plurality of sense amplifier units, each positioned at one side of each cell array block to correspond one by one to the cell array block, for sensing and amplifying the sensing voltage of the main bit line;
   a main amplifier unit for amplifying data outputted from the sense amplifier unit to a data buffer; and
   a data bus unit for connecting the main amplifier unit to the sense amplifier units to transmit data to be read or written.

2. The nonvolatile ferroelectric memory device according to claim 1, wherein the data bus unit comprises:
   a plurality of local data buses which correspond one bye one to the sense amplifier units and are positioned at one side of the sense amplifier unit in parallel with the main bit line, for transmitting data sensed in the sense amplifier and data to be written in the cell array block to the sense amplifier unit;
   a global data bus, selectively connected to the plurality of local data buses, for coupling the main amplifier with the local data bus to transmit data; and
   a plurality of data bus switch arrays for selectively connecting the global data bus to the local data bus.

3. The nonvolatile ferroelectric memory device according to claim 2, wherein the cell array block selectively pulls down the plurality of sub bit lines in response to a plurality of sub bit line pull down signals corresponding one by one to the plurality of sub bit lines before cell data are sensed.

4. The nonvolatile ferroelectric memory device according to claim 3, wherein the sense amplifier unit comprises a plurality of sense amplifiers, corresponding one by one to the main bit lines, for sensing a voltage of the corresponding main bit line,
   wherein each of the sense amplifiers comprises:
   a column selecting unit for selectively outputting the sensing voltage of the main bit line in response to a column selecting signal;
   a MBL sensing unit for sensing a sensing voltage of the main bit line transmitted through the column selecting unit when a sensing signal is activated and for variably regulating a level of sensing load depending on the sensed voltage;
   a first sensing load unit for applying the sensing load to the MBL sensing unit and regulating the amount of the load applied depending on a reference voltage;
   a reference voltage generating unit for generating the reference voltage in response to a reference voltage regulating signal when a reference voltage column selecting signal is activated;
   a comparison amplification unit for comparing an output voltage of the reference voltage generating unit with that of the MBL sensing unit and amplifying an output voltage of the MBL sensing unit to output the amplified voltage to the local data bus; and
   a write/restore regulation unit for transmitting write/read data applied to the local data bus to the column selecting unit.

5. The nonvolatile ferroelectric memory device according to claim 4, wherein the MBL sensing unit inverts and amplifies the sensing voltage, and varies channel resistance of a switching means connected between output nodes of the column selecting unit and the first sensing load depending on the level of the inverted and amplified voltage to regulate the level of the sensing load.

6. The nonvolatile ferroelectric memory device according to claim 5, wherein the first sensing load unit varies the channel resistance of the switching means connected between a power voltage terminal and the output node of the MBL sensing unit depending on the reference voltage to regulate the sensing load applied to the MBL sensing unit.

7. The nonvolatile ferroelectric memory device according to claim 4, wherein the reference voltage generating unit comprises:
   a reference current regulation unit for regulating current leakage of the reference voltage generating unit in response to the reference voltage regulating signal to variably induce generation of the reference voltage;
   a reference voltage sensing unit, when the sensing signal is activated, for sensing an output voltage of the reference current regulation unit and variably regulating the level of sensing load applied depending on the sensed voltage level to output the reference voltage; and
   a second sensing load unit for applying the sensing load to the reference voltage sensing unit and regulating a load applied depending on the reference voltage.

8. The nonvolatile ferroelectric memory device according to claim 7, wherein the reference voltage sensing unit inverts and amplifies an output voltage of the reference current regulating unit, varies the channel resistance of the switching means connected between output nodes of the reference current regulating unit and the second sensing load unit depending on the level of the inverted and amplified voltage, and regulates the level of the sensing load.

9. The nonvolatile ferroelectric memory device according to claim 8, wherein the second sensing load unit varies the channel resistance of the switching means connected between a power voltage terminal and the reference voltage sensing unit depending on the reference voltage, and regulates a sensing load applied to the reference voltage sensing unit.

10. The nonvolatile ferroelectric memory device according to claim 1, wherein the cell array block selectively pulls down the plurality of sub bit lines in response to a plurality of sub bit line pull down signals corresponding one by one to the plurality of sub bit lines before cell data are sensed.

11. The nonvolatile ferroelectric memory device according to claim 10, wherein the sense amplifier unit comprises a plurality of sense amplifiers, corresponding one by one to the main bit lines, for sensing a voltage of the corresponding main bit line, wherein each of the sense amplifiers comprises:
  a column selecting unit for selectively outputting the sensing voltage of the main bit line in response to a column selecting signal;
  a MBL sensing unit for sensing a sensing voltage of the main bit line transmitted through the column selecting unit when a sensing signal is activated and for variably regulating a level of sensing load depending on the sensed voltage;
  a first sensing load unit for applying the sensing load to the MBL sensing unit and regulating the amount of the load applied depending on a reference voltage;
  a reference voltage generating unit for generating the reference voltage in response to a reference voltage regulating signal when a reference voltage column selecting signal is activated;
  a comparison amplification unit for comparing an output voltage of the reference voltage generating unit with that of the MBL sensing unit and amplifying an output voltage of the MBL sensing unit to output the amplified voltage to the local data bus; and
  a write/restore regulation unit for transmitting write/read data applied to the local data bus to the column selecting unit.

12. The nonvolatile ferroelectric memory device according to claim 11, wherein the MBL sensing unit inverts and amplifies the sensing voltage, and varies channel resistance of a switching means connected between output nodes of the column selecting unit and the first sensing load depending on the level of the inverted and amplified voltage to regulate the level of the sensing load.

13. The nonvolatile ferroelectric memory device according to claim 12, wherein the first sensing load unit varies the channel resistance of the switching means connected between a power voltage terminal and the output node of the MBL sensing unit depending on the reference voltage to regulate the sensing load applied to the MBL sensing unit.

14. The nonvolatile ferroelectric memory device according to claim 11, wherein the reference voltage generating unit comprises:
  a reference current regulation unit for regulating current leakage of the reference voltage generating unit in response to the reference voltage regulating signal to variably induce generation of the reference voltage;
  a reference voltage sensing unit, when the sensing signal is activated, for sensing an output voltage of the reference current regulation unit and variably regulating the level of sensing load applied depending on the sensed voltage level to output the reference voltage; and
  a second sensing load unit for applying the sensing load to the reference voltage sensing unit and regulating a load applied depending on the reference voltage.

15. The nonvolatile ferroelectric memory device according to claim 14, wherein the reference voltage sensing unit inverts and amplifies an output voltage of the reference current regulating unit, varies the channel resistance of the switching means connected between output nodes of the reference current regulating unit and the second sensing load unit depending on the level of the inverted and amplified voltage, and regulates the level of the sensing load.

16. The nonvolatile ferroelectric memory device according to claim 15, wherein the second sensing load unit varies the channel resistance of the switching means connected between a power voltage terminal and the reference voltage sensing unit depending on the reference voltage, and regulates a sensing load applied to the reference voltage sensing unit.

17. The nonvolatile ferroelectric memory device according to claim 1, wherein each of the plurality of cell array blocks has a cell array structure of a folded bit line type where unit cells connected to the plurality of sub bit lines do not share a word line.

\* \* \* \* \*